(12) United States Patent
Ahn et al.

(10) Patent No.: US 8,837,253 B2
(45) Date of Patent: Sep. 16, 2014

(54) PROGRAMMING PULSE GENERATION CIRCUIT AND NON-VOLATILE MEMORY APPARATUS HAVING THE SAME

(75) Inventors: Chang Yong Ahn, Icheon-si (KR); Sung Yeon Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 13/585,550

(22) Filed: Aug. 14, 2012

(65) Prior Publication Data
US 2013/0163349 A1     Jun. 27, 2013

(30) Foreign Application Priority Data

Dec. 22, 2011   (KR) .................. 10-2011-0140444

(51) Int. Cl.
*G11C 7/12*     (2006.01)

(52) U.S. Cl.
USPC . 365/230.06; 365/163; 365/148; 365/189.16; 365/191

(58) Field of Classification Search
USPC ............... 365/163, 148, 189.16, 191, 230.06
See application file for complete search history.

(56) References Cited

U.S. PATENT DOCUMENTS

| | | | |
|---|---|---|---|
| 2005/0141261 A1* | 6/2005 | Ahn | 365/148 |
| 2005/0195633 A1* | 9/2005 | Choi et al. | 365/148 |
| 2006/0109720 A1* | 5/2006 | Cho et al. | 365/189.11 |
| 2006/0157679 A1* | 7/2006 | Scheuerlein | 257/2 |
| 2007/0133267 A1* | 6/2007 | Cho et al. | 365/163 |
| 2010/0290273 A1* | 11/2010 | Yoon et al. | 365/163 |
| 2012/0106242 A1* | 5/2012 | Lee et al. | 365/163 |
| 2012/0106243 A1* | 5/2012 | Lym et al. | 365/163 |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A program pulse generation circuit includes: a set pulse generator configured to apply a set pulse to an output node in response to a driving signal, a set pulse control signal, and a first switching signal, and a current controller configured to control step reductions forming the set pulse in response to the driving signal and a second switching signal.

20 Claims, 8 Drawing Sheets

PROGRAMMING PULSE GENERATION CIRCUIT AND NON-VOLATILE MEMORY APPARATUS HAVING THE SAME

CROSS-REFERENCES TO RELATED APPLICATION

The present application claims priority under 35 U.S.C. §119(a) to Korean application number 10-2011-0140444, filed on Dec. 22, 2011, in the Korean Intellectual Property Office, which is incorporated herein by reference in its entirety.

BACKGROUND

1. Technical Field

The present invention relates to a semiconductor memory apparatus, and more particularly, to a programming pulse generation circuit and a non-volatile memory apparatus having the same.

2. Related Art

Examples of the nonvolatile memory apparatus include a flash memory apparatus, a phase-change memory apparatus, a magnetic memory apparatus, and the like. Among the memory apparatuses, the phase-change memory apparatus and the magnetic memory apparatus are nonvolatile memory apparatuses that are able to write and sense data according to a current driving method.

The level of data stored in each memory cell forming the phase change memory apparatus is determined according to a crystalline state of a phase change material. When data is written into a phase change memory cell, the phase change material becomes molten due to a write current from a bottom electrode to a top electrode that passes through it. The resistance based on the cooling rate of the phase change material dictates the reset and set states. A high-resistance state defines a reset state, and a low-resistance statedefines a set state.

FIG. 1 is a graph showing resistance distributions of phase change memory cells.

FIG. 1 illustrates a resistance distribution RRST when phase change materials forming the phase change memory cells are in a high-resistance state, i.e., a reset state, and a resistance distribution RSET when the phase change materials are in a low-resistance state, i.e., a set state.

Referring to FIG. 1, since the data distributions in the set state and the reset state are wide, a sensing margin is reduced, which may lead to an error during a data read operation. There is a demand for a method to solve this problem.

In order to prevent a data read failure, a high-sensitivity sense amplifier may be adopted. However, this may need to be done cautiously since the high-sensitivity sense amplifier occupies a large area, thereby creating an obstacle to miniaturization efforts of the semiconductor apparatus.

Thus, a method of concentrating a resistance distribution of memory cells through a program and verify (PNV) operation for the memory cells may alternatively be used.

FIG. 2 is a graph explaining resistance distributions of memory cells after a PNV operation.

As the PNV operations are repetitively performed, the data distribution is more concentrated, sufficiently increasing the sensing margin. The repetition number of PNV operations is an important factor to determine a program operation time. As the PNV repetition number increases, the program operation time increases.

FIG. 3 is a configuration diagram of a conventional program pulse generation circuit. In particular, FIG. 3 illustrates a circuit to generate a pulse for programming set data.

In general, a slow quenching pulse is provided to place a phase change memory cell into a set state. The circuit illustrated in FIG. 3 generates a slow quenching pulse.

Referring to FIG. 3, the program pulse generation circuit 10 may include a driving signal generator 12 and a set pulse generator 14.

The driving signal generator 12 is configured to generate a driving signal CSB in response to an enable signal EN. The set pulse generator 14 includes a plurality of switching elements configured to drive a current, according to a driving signal CSB and a plurality of transmission gates configured to be switched by set pulse control signals SETP<1:15> and its complement signals /SETP<1:15>, to an output node IOUT. Here, each of the switching elements is designed to drive the same amount of current X(1/N).

The set pulse generator 14 illustrated in FIG. 3 includes 15 transmission gates switched by the set pulse control signals SETP<1:15>. As the set pulse control signals SETP<1:15> are sequentially disabled, a slow quenching set pulse is applied to the output node IOUT.

FIG. 4 is a diagram showing an output pulse of the program pulse generation circuit illustrated in FIG. 3.

When the set pulse control signals SETP<1:15> are all enabled, the output node IOUT provides a melting current IMelting capable of melting a phase change material. The set pulse control signals SETP<1:15> are then sequentially disabled to slowly cool down the phase change material. Typically, this is done by disabling the set pulse control signal associated with the transmission gate farthest away from the output node IOUT.

As the set pulse control signals SETP<1:15> are sequentially disabled after the melting current IMelting is applied to the output node IOUT for a designated time, the current applied to the output node IOUT decreases in a stepwise manner as illustrated in FIG. 4. Since the switching elements driven by the driving signal CSB have the same current drivability, the step pulses have the same current reduction X.

FIG. 5 is a diagram showing a form of the program pulse illustrated in FIG. 4 applied to a cell array.

Specifically, the step-type program pulse illustrated in FIG. 4 is applied in such a manner as illustrated in FIG. 5 by driving through a global bit line and a local bit line when the program pulse is applied to the cell array.

However, the step-type program pulse rapidly decreases in the final period thereof. Since the current supply is completely cut off when the final transmission gate is turned off, the final step wave does not gradually decrease, but is rather rapidly cut off.

In many cases, Germanium-Antimony-Tellurium, or GST, is used as a phase change material to form a phase change memory cell. GST is an important factor when the reduction of the final step wave of the program pulse affects cell distribution. As the reduction of the final step wave increases, cell distribution is degraded.

Thus, if the reduction of the final step wave is controlled during the generation of the set pulse, the resistance distribution of phase change memory cells may be improved.

SUMMARY

In one embodiment of the present invention, a program pulse generation circuit includes: a set pulse generator configured to apply a set pulse, having a stepwise waveform that sequentially decreases, to an output node in response to a driving signal, a set pulse control signal, and a first switching signal; and a current controller configured to control reductions of step waves forming the set pulse in response to the driving signal and a second switching signal.

In another embodiment of the present invention, a program pulse generation circuit includes: a set pulse generator comprising a plurality of current driving units connected in parallel between a power supply terminal and an output node, and configured to drive a driving signal in response to set pulse control signals in order to apply a set pulse, having a stepwise waveform that sequentially decreases, to an output node; and a current controller configured to drive the driving signal in response to a second switching signal and control current amounts of two or more current driving units.

In another embodiment of the present invention, a nonvolatile memory apparatus includes: a memory cell array; a write driver configured to provide a program current to the memory cell array in response to a program command; and a program pulse generation circuit configured to generate a set pulse, having a stepwise waveform that sequentially decreases, as the program current of which a final step wave has a reduction controlled to a first value.

BRIEF DESCRIPTION OF THE DRAWINGS

Features, aspects, and embodiments are described in conjunction with the attached drawings, in which.

DETAILED DESCRIPTION

Hereinafter, a programming pulse generation circuit and a non-volatile memory apparatus having the same according to the present invention will be described below with reference to the accompanying drawings through various embodiments.

Figure 6:
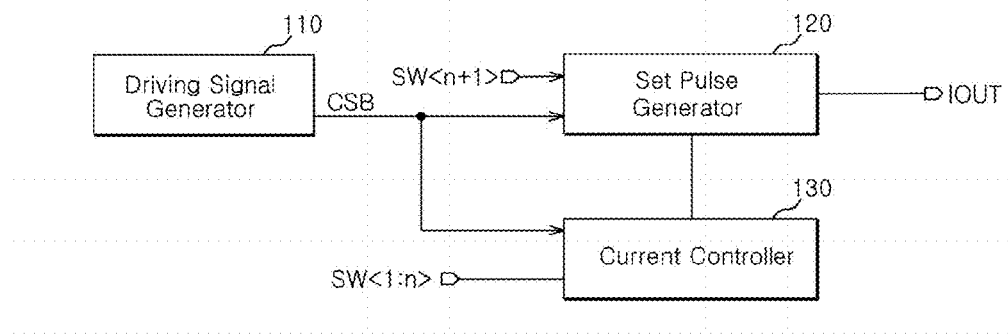
FIG. 6 is a configuration diagram of a program pulse generation circuit according to one embodiment of the present to invention.

FIG. 6 is a configuration diagram of a program pulse generation circuit according to one embodiment of the present invention.

The program pulse generation circuit 100 according to the embodiment of the present invention may include a driving signal generator 110, a set pulse generator 120, and a current controller 130.

The program pulse generation circuit 100 operates in a default mode or current control mode, and switching signals SW<1:n+1> are selectively enabled according to the operation mode.

The driving signal generator 110 is configured to generate a driving signal CSB in response to an enable signal EN not shown.

The set pulse generator 120 is configured to be driven according to the driving signal CSB to apply a set pulse to an output node IOUT. In the default mode, the set pulse generator 120 outputs a set pulse in a stepwise waveform which decreases at even intervals when a melting current IMelting is applied to the output node IOUT for a designated time while the switching signal SW<n+1> are enabled. In the current control mode, the switching signal SW<n+1> provided to the set pulse generator 120 is disabled.

The current controller 130 is driven according to the driving signal CSB, and varies the reduction in the current amount of the set pulse generator 120, or particularly, provides reductions of at least two step waves of the step-type set pulse, according to the switching signals SW<1:n> which are selectively enabled in the current control mode. The current controller 130 controls the step waves such that the reduction of any one step wave, such as the final step, desirably decreases at the expense of an increase in the other step wave. The sum of decreases in reduction is controlled to be equal to the sum of increases in reduction.

Specifically, when any one switching signal SW<n+1> of the switching signals SW<1:n+1> is disabled and another switching signal SW<n> is enabled in the current control mode, the reduction of the final step wave may be attenuated. When the reduction of the final step wave is attenuated, current compensation may be performed by the switching signals SW<1:n-1>.

In this embodiment of the present invention, whether to operate the program pulse generation circuit in the default mode or the current control mode may be decided by an operator, and so if operation in the current control mode is desired, the operator may decide which signal to enable among the switching signals SW<1:n-1>.

Figure 7:
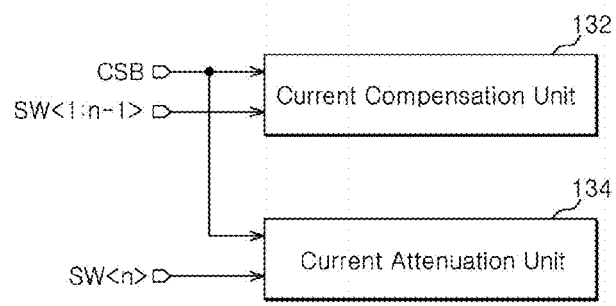
FIG. 7 is a configuration diagram of a current controller illustrated in FIG. 6.

FIG. 7 is a configuration diagram of the current controller illustrated in FIG. 6.

Referring to FIG. 7, the current controller 130 may include a current compensation unit 132 and a current attenuation unit 134.

The current attenuation unit 134 is driven by the driving signal CSB, and attenuates the reduction of the final step wave of the set pulse generator 120 when the switching signal SW<n> is enabled.

The current compensation unit 132 is driven by the driving signal CSB, and compensates for the current attenuated by the current attenuation unit 134 by increasing the current reduction of the other step waves excluding the final step wave of the step-type set pulse generated by the set pulse generator 120, when the switching signals SW<1:n-1> are selectively enabled.

Figure 8:
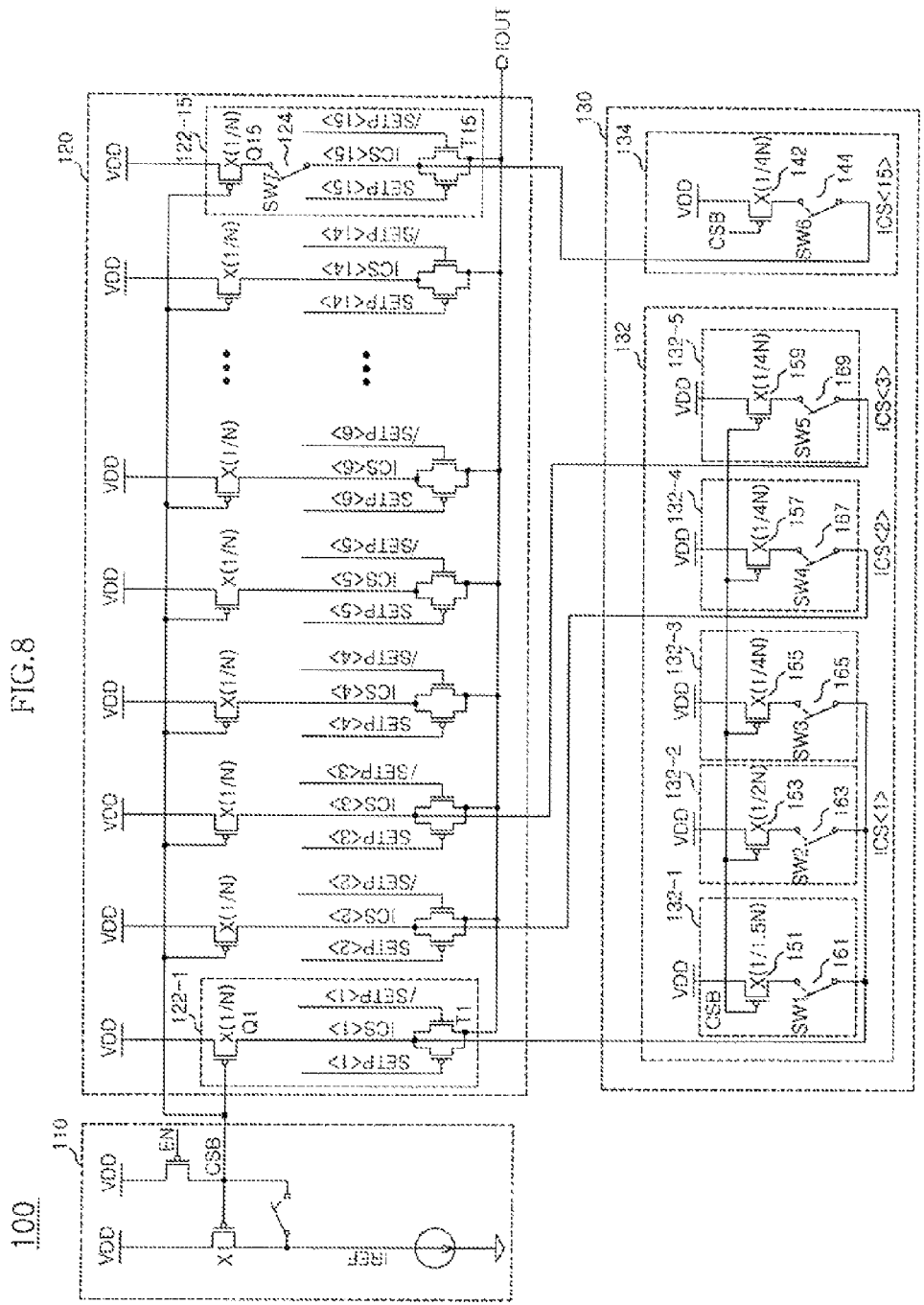
FIG. 8 is a circuit diagram of the program pulse generation circuit illustrated in FIG. 6.

FIG. 8 is a circuit diagram of the program pulse generation circuit illustrated in FIG. 6, showing a case in which the switching signals SW<1:n+1> are inputted as switching signals SW<1:7>.

The set pulse generator 120 provides a set pulse, having a stepwise waveform that sequentially decreases, to the output node IOUT in response to the driving signal CSB provided from the driving signal generator 110 and the set pulse control signals SETP<1:15> and /SETP<1:15> provided from a main controller, both not illustrated.

FIG. 8 illustrates a case in which the set pulse generator 120 includes a plurality of current driving units 122-1 to 122-15 connected in parallel between a power supply voltage terminal VDD and the output node IOUT.

The respective current driving units 122-1 to 122-15 may include switching elements Q1 to Q15 and transmission gates T1 to T15. The switching elements Q1 to Q15 are connected between the power supply voltage terminal VDD and current supply lines ICS<1:15>, and the transmission gates T1 to T15 are connected between the current supply lines ICS<1:15> and the output node IOUT. Here, the respective switching elements Q1 to Q15 are driven by the driving signal CSB, and the respective transmission gates T1 to T15 are driven by the set pulse control signals SETP<1:15>.

In addition, any one current driving unit 122-15 included in the set pulse generator 120 may further include a current control switch 124 connected between the switching element Q15 and the current supply line ICS<15> and driven by the switching signal SW<7>.

During the initial operation, the set pulse control signals SETP<1:15> are all enabled to assist in applying a corresponding current to the output node IOUT. When a preset time passes after the current approaches the current level IMelting where a phase change material starts to melt, the set pulse control signals SETP<1:15> are sequentially disabled by controlling of the main controller.

The current attention unit 134 may include a switching element 142 and a current attenuation switch 144 which are connected in series between the power supply voltage terminal VDD and the current supply line ICS<15> having the current control switch 124 provided therein. The switching element 142 is driven by the driving signal CSB, and the current attenuation switch 144 is driven by any one switching signal of the switching signals, e.g., SW<6>.

In this embodiment of the present invention, the switching signal SW<7> to drive the current control switch 124 may be configured to be enabled to turn on the current control switch 124 in the default mode and to be disabled in the current control mode.

The current attenuation unit 134 may include a switching element 142 and a current attenuation switch 144 which are connected in series between the power supply voltage terminal VDD and the current supply line ICS<15> having the current control switch 124 provided therein. The switching element 142 is driven by the driving signal CSB, and the current attenuation switch 144 is driven by any one switching signal SW<6> of the switching signals.

The respective switching elements forming the set pulse generator 120 each have the same current drivability of X(1/N). The switching element 142 forming the current attenuation unit has a current drivability of X(1/4N) which is smaller than that of the switching elements of the set pulse generator 120. Therefore, when the current control switch 124 is turned off and the current attenuation switch 144 is turned on in the current control mode, the reduction of the final step wave of the set pulse may be attenuated.

The attenuated current amount may be compensated for by the current compensation unit 132.

As illustrated in FIG. 8, the current compensation unit 132 may include compensation current providing sections 132-1 to 132-5 connected between the power supply terminal VDD and one or more current supply lines.

The respective compensation current providing sections 132-1 to 132-5 may include switching elements 151, 153, 155, 157, and 159 and current compensation switches 161, 163, 165, 167, and 169, respectively, which are connected between the power supply terminal VDD and the current supply lines ICS<1:3>. The switching elements 151, 153, 155, 157, and 159 are driven by the driving signal CSB, and the current compensation switches 161, 163, 165, 167, and 169 are driven by the switching signals SW<1:5>, respectively. The current drivability of the switching elements 151, 153, 155, 157, and 159 may be set smaller than that of the switching elements of the set pulse generator 120 such that the current amount attenuated by the current attenuation unit 134 may be compensated.

FIG. 8 illustrates a case in which the first to third compensation current providing sections 132-1 to 132-3 are is connected in parallel between the power supply terminal VDD and the first current supply line ICS<1>, the fourth compensation current providing section 132-4 is connected between the power supply voltage VDD and the second current supply line ICS<2>, and the fifth compensation current providing section 132-5 is connected between the power supply terminal VDD and the third current supply line ICS<3>. However, the present invention is not limited thereto.

The current drivability of the switching elements 151, 153, 155, 157, and 159 may be designed to compensate for the current amount attenuated by the current attenuation unit 134. The current compensation operation may be performed by driving one or more current compensation switches 161, 163, 165, 167, and 169 according to the switching signals SW<1:5>.

Figure 9:
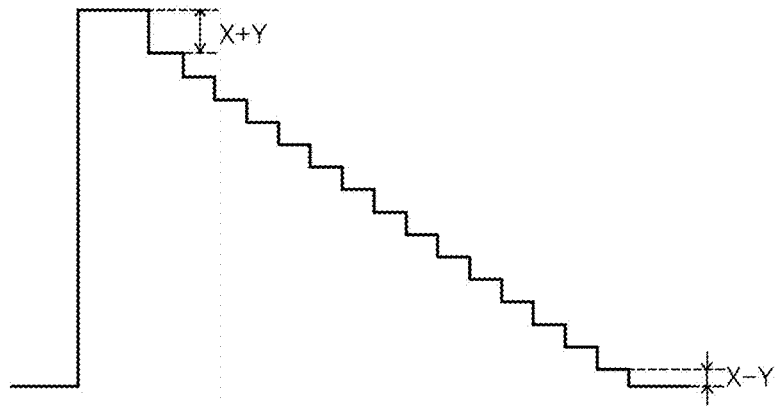
FIG. 9 is a diagram showing an example of a pulse outputted from the program pulse generation circuit illustrated in FIG. 8.

FIG. 9 is a diagram showing an example of the pulse outputted from the program pulse generation circuit illustrated in FIG. 8.

In the current control mode, the current control switch 124 is turned off, i.e., opened, and the current attenuation switch 144 of the current attenuation unit 134 is turned on, i.e., closed. Thus, one or more of the current compensation switches 161, 163, 165, 167, and 169 forming the current compensation unit 132 may be turned on, i.e., closed to compensate for the attenuated current amount. In this embodiment of the present invention, the current compensation switches 161, 163, 165, 167, and 169 connected to the switching elements 151, 153, 155, 157, and 159 capable of compensating for the current amount attenuated by the current attenuation switch 144 may be turned on, i.e., closed to equally contribute in maintaining the total current amount.

FIG. 9 illustrates a case in which a reduction of a final step wave is attenuated to X−Y by the current attenuation unit 134, and a reduction of a first step wave is increased to X+Y. The other step waves, from the second step wave to the fourteenth step wave, have the same reduction of X.

Figure 10:
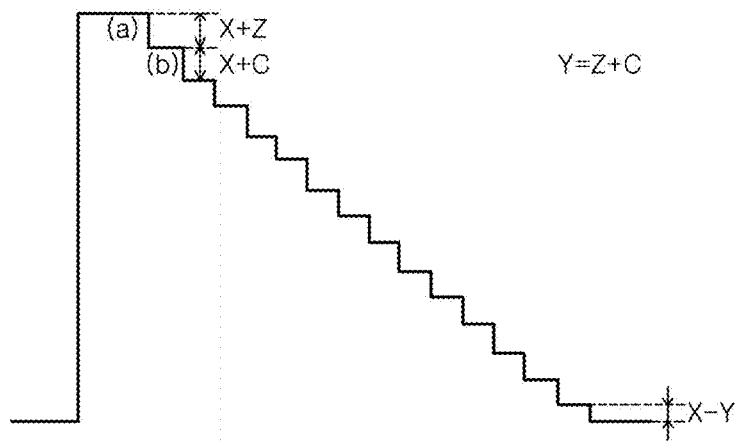
FIG. 10 is a diagram showing another example of the pulse generated from the program pulse generation circuit illustrated in FIG. 8.

FIG. 10 is a diagram showing another example of the pulse generated from the program pulse generation circuit illustrated in FIG. 8.

In this embodiment of the present invention, a plurality of current compensation switches, for example, two current compensation switches among the current compensation switches 161, 163, 165, 167, and 169 forming the current compensation unit 134, are turned on to compensate for the current amount.

Referring to FIG. 10, it can be seen that for a current reduction of a final step wave to be attenuated by X−Y, a current reduction (a) of a second step wave is increased by Z and a current reduction (b) of a third step wave is increased by C, in order to compensate for the current amount.

Figure 11:
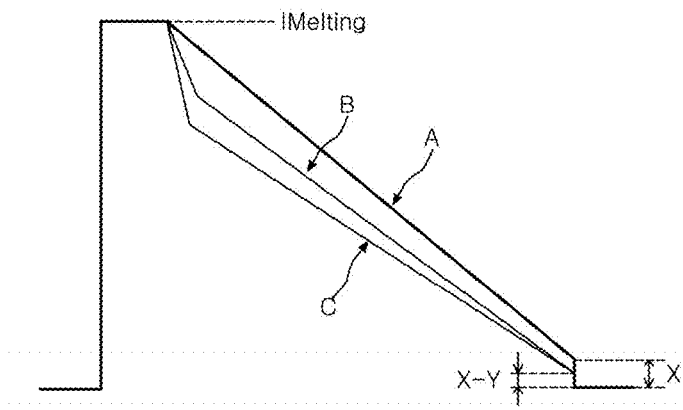
FIG. 11 is a diagram showing the form of a pulse applied to the cell array depending on the form of the program pulse.

FIG. 11 is a diagram showing the form of a pulse applied to the cell array, depending on the form of a program pulse.

The step-type program pulse illustrated in FIGS. 9 and 10 are applied in such a form as illustrated in FIG. 11 by loading through a global bit line and a local bit line, when applied to the memory cell array.

Figure 1:
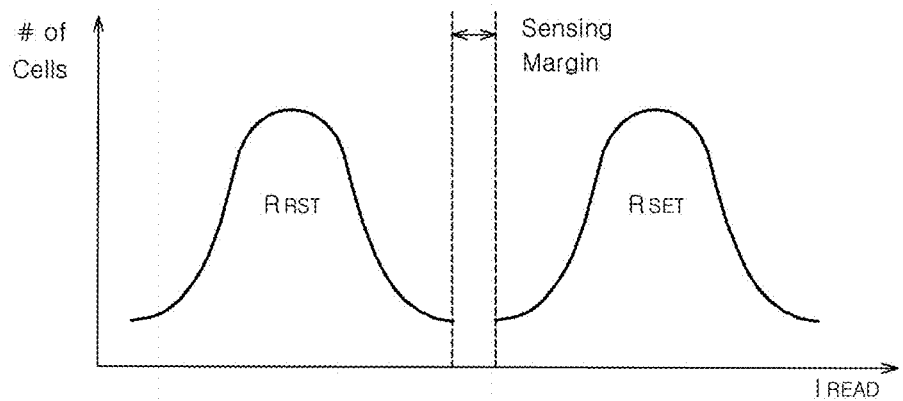
FIG. 1 is a graph showing resistance distributions of phase change memory cells.
Figure 2:
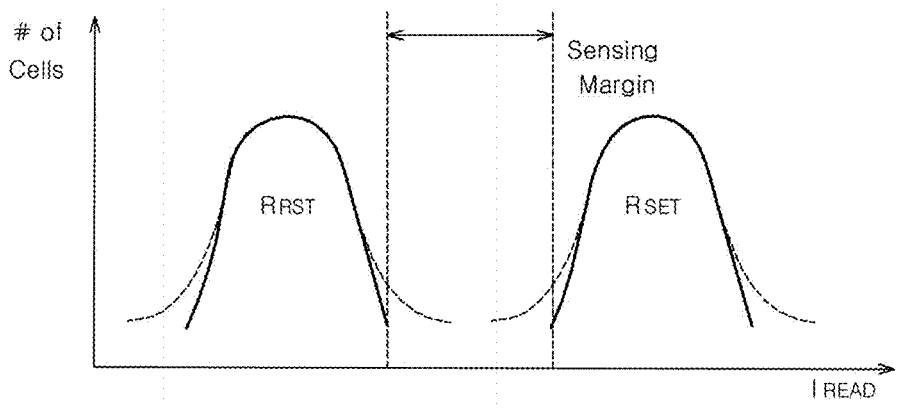
FIG. 2 is a graph showing resistance distributions of memory cells after a PNV operation.
Figure 3:
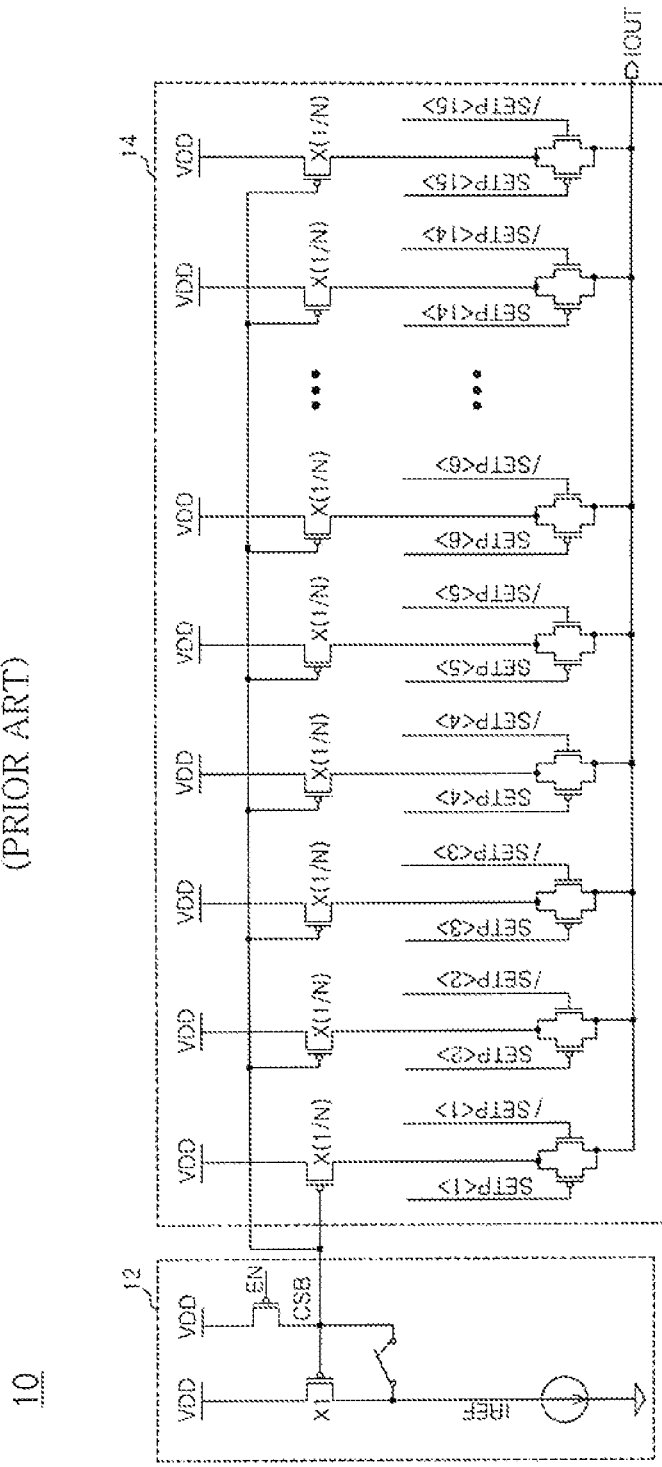
FIG. 3 is a configuration diagram of a conventional program pulse generation circuit.
Figure 4:
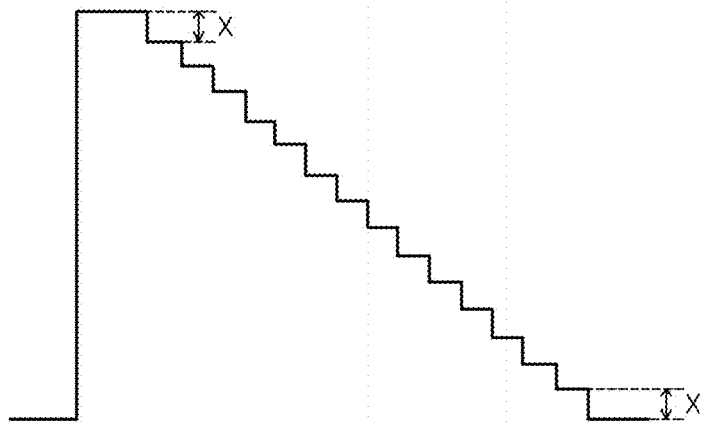
FIG. 4 is a diagram showing an output pulse of the program pulse generation circuit illustrated in FIG. 3.
Figure 5:
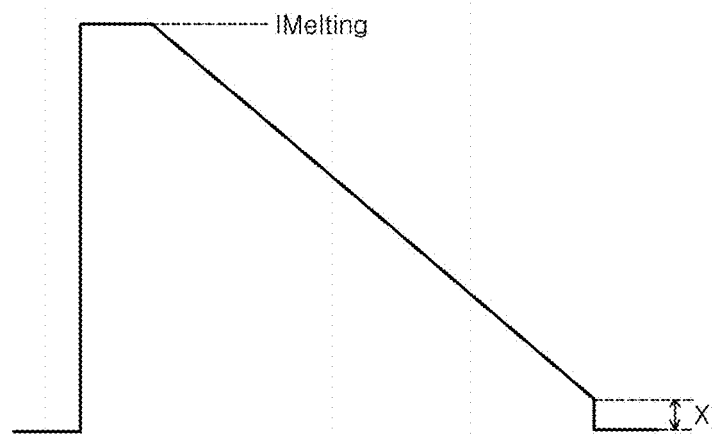
FIG. 5 is a diagram showing a form of the program pulse illustrated in FIG. 4 applied to a cell array.

In the default mode, when the current controller 130 is not used, the output waveform of the program pulse generation circuit 100 is indicated as illustrated in FIG. 4. In this case, the step-type program pulse rapidly decreases in the final period thereof, as shown by graph A in FIG. 11.

However, when the current controller 130 is used to control the reduction of the final step wave and a current attenuated in any one of the other step waves is compensated for to generate a current pulse in such a form as illustrated in FIG. 9, the reduction of the final step wave may be controlled to X–Y as indicated by graph B in FIG. 11.

Similarly, when the reduction of the final step wave is controlled and the reductions of two step waves of the other step waves are increased as illustrated in FIG. 10, a set pulse may be applied as indicated by graph C in FIG. 11.

Figure 12:
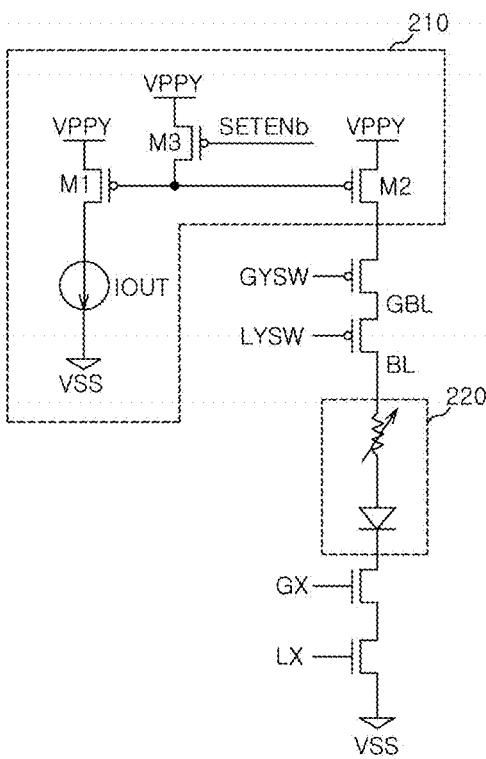
FIG. 12 is a schematic view of a nonvolatile memory apparatus to which the embodiment of the present invention is applied.

FIG. 12 is a schematic view of a nonvolatile memory apparatus to which the embodiment of the present invention is applied.

FIG. 12 illustrates a phase change memory apparatus which is a representative example of the nonvolatile memory apparatus employing a current driving method, and includes a write driver 210 and a memory cell 220.

The write driver 210 includes current mirroring units M1 and M2 and a driving unit M3. The current mirroring units M1 and M2 are configured to receive a write pulse IOUT, mirror a current decided by the current level of the write pulse IOUT, and provide the mirrored current to the memory cell 220. The driving unit M3 is configured to drive the write driver 210.

In the write driver illustrated in FIG. 12, the write pulse IOUT may include a set pulse applied from the aforementioned program pulse generation circuit 100.

When the current controller 130 is used to control the reduction of the final step wave in order to supply the set pulse a slow quenching pulse, it is important to control a time point where a write enable signal SETENb is disabled.

Figure 13:
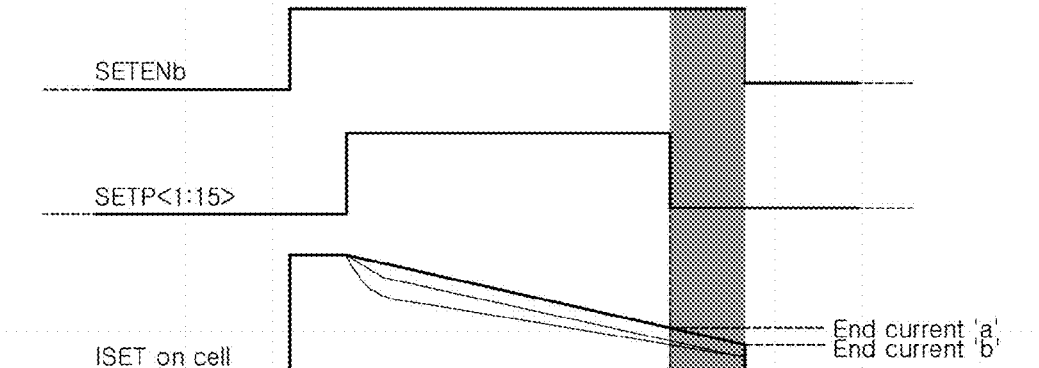
FIG. 13 is a timing diagram showing the program operation according to an embodiment of the present invention.

FIG. 13 is a timing diagram explaining the program operation according to the embodiment of the present invention.

Referring to FIGS. 12 and 13, when the write enable signal SETENb and the set pulse control signals SETP<1:15> are disabled to a low level to turn off the write driver 210, the level of the final step wave decreases as indicated by 'a'.

On the other hand, when the write driver 210 is turned off after the set pulse control signals SETP<1:15> are turned off, the level of the final step wave decreases as indicated by 'b'.

Therefore, the reduction of the final step wave of the set pulse may be stably decreased by turning off the write driver 210 is after a predetermined time passes from a time point where the set pulse control signals SETP<1:15> were turned off.

Even though the current supplied from the program pulse generation circuit 100 is not rapidly cut off, the write driver 210 is disabled after the program pulse (set pulse) was completely supplied, which makes it possible to prevent the final step wave from rapidly decreasing.

When a composition ratio of GST among phase change materials is (2, 2, 5,) or (4, 1, 1) and the reduction of the final step wave is controlled by the aforementioned program pulse generation circuit 100, the data distribution is concentrated in the center.

When such a method is used during a set program operation, the PNV repetition number may be significantly reduced. Therefore, it is possible to drastically reduce the program operation time.

While certain embodiments have been described above, it will be understood to those skilled in the art that the embodiments described are by way of example only. Accordingly, the memory apparatus described herein should not be limited based on the described embodiments. Rather, the memory apparatus described herein should only be limited in light of the claims that follow when taken in conjunction with the above description and accompanying drawings.

What is claimed is:

1. A program pulse generation circuit comprising:
    a set pulse generator configured to apply a set pulse, having a stepwise waveform that sequentially decreases, to an output node in response to a driving signal, a set pulse control signal, and a first switching signal; and
    a current controller configured to control reductions of step waves forming the set pulse in response to the driving signal and a second switching signal,
    wherein the first switching signal and the second switching signal are selectively enabled, and
    wherein the current controller decreases the reduction of the final step wave of the step-type set pulse to a first value.

2. The program pulse generation circuit according to claim 1, wherein the current controller increases the reductions of one or more step waves excluding the final step wave such that the sum of the increased reductions corresponds to the first value.

3. The program pulse generation circuit according to claim 1, wherein the program pulse generation circuit operates in any one of a default mode and a current control mode, and
    wherein the current controller is enabled in the current control mode.

4. The program pulse generation circuit according to claim 3, wherein, in the default mode, the first switching signal is enabled.

5. The program pulse generation circuit according to claim 3, wherein, in the current control mode, the first switching signal is disabled and the second switching signal is selectively enabled.

6. A program pulse generation circuit comprising:
    a set pulse generator comprising a plurality of current driving units connected in parallel between a power supply terminal and an output node, and configured to be driven in response to a driving signal and set pulse control signals in order to apply a set pulse, having a stepwise waveform that sequentially decreases, to an output node; and
    a current controller configured to be driven in response to the driving signal, and control current amounts of two or more current driving units in response to a second switching signal,
    wherein each of the current driving units comprises:
        a switching element connected between the power supply voltage terminal and a current supply line and driven by the driving signal; and
        a transmission gate connected between the current supply line and the output node and driven by one of the set pulse control signals; and
        any one of the current driving units further comprises a current control switch connected between the switching element and the current supply line and driven by a first switching signal.

7. The program pulse generation circuit according to claim 6, wherein the set pulse control signals are all enabled during an initial operation and then sequentially disabled after a designated time, and wherein the current driving unit connected to the current control switch receives the set pulse control signal which is finally disabled.

8. The program pulse generation circuit according to claim 7, wherein the current controller comprises:
   a current attenuation unit connected between the power supply voltage terminal and a current supply line connected to the current control switch; and
   a current compensation unit comprising one or more compensation current providing sections connected between the power supply voltage terminal and one or more current supply lines excluding the current supply line connected to the current control switch.

9. The program pulse generation circuit according to claim 8, wherein the current attenuation unit comprises a switching element and a current attenuation switch which are connected in series between the power supply voltage and the current supply line,
   wherein the switching element is driven by the driving signal, and the current attenuation switch is driven by the second switching signal.

10. The program pulse generation circuit according to claim 8, wherein each of the compensation current providing sections comprises a switching element and a current compensation switch which are connected in series between the power supply voltage terminal and the current supply line,
   wherein the switching element is driven by the driving signal, and the current compensation switch is driven by the second switching signal.

11. The program pulse generation circuit according to claim 8, wherein the current attenuation unit reduces the amount of current applied to the current supply line connected to the current control switch.

12. The program pulse generation circuit according to claim 11, wherein the one or more compensation current providing sections increase amounts of current applied to one or more current supply lines excluding the current supply line connected to the current control switch.

13. The program pulse generation circuit according to claim 12, wherein the sum of current amounts increased by the compensation current providing sections is equal to the current amount reduced by the current attenuation unit.

14. A nonvolatile memory apparatus comprising:
   a memory cell array;
   a write driver configured to provide a program current to the memory cell array in response to a program command; and
   a program pulse generation circuit configured to generate a set pulse, having a stepwise waveform that sequentially decreases,
   wherein the program current of a final step wave has a decreased reduction controlled to a first value, and the program current of at least one of the step waves excluding the final step wave has an increased reduction controlled by the first value.

15. The nonvolatile memory apparatus according to claim 14, wherein the program pulse generation circuit comprises:
   a set pulse generator configured to apply the set pulse, having a stepwise waveform that sequentially decreases, to an output node in response to a driving signal, a set pulse control signal, and a first switching signal; and
   a current controller configured to control the reduction of the final step wave to the first value in response to the driving signal and a second switching signal.

16. The nonvolatile memory apparatus according to claim 15, wherein the current controller decreases the reduction of the final step wave to the first value.

17. The nonvolatile memory apparatus according to claim 16, wherein the current controller increases reductions of one or more step waves excluding the final step wave such that the sum of the increased reductions corresponds to the first value.

18. The program pulse generation circuit according to claim 15, wherein the program pulse generation circuit operates in any one of a default mode and a current control mode, and
   wherein the current controller is enabled in the current control mode.

19. The program pulse generation circuit according to claim 18, wherein the first switching signal is enabled in the default mode.

20. The program pulse generation circuit according to claim 18, wherein the first switching signal is disabled and the second switching signal is selectively enabled in the current control mode.

* * * * *